United States Patent
Baccini et al.

(10) Patent No.: US 9,935,224 B2
(45) Date of Patent: Apr. 3, 2018

(54) ENCAPSULATING LAYER ADAPTED TO BE APPLIED TO BACK-SHEETS FOR PHOTOVOLTAIC MODULES INCLUDING BACK-CONTACT CELLS

(71) Applicant: EBFOIL S.R.L., Bologna (IT)

(72) Inventors: Elisa Baccini, Carbonera (IT); Luigi Marras, Medea (IT); Bruno Bucci, Castenaso (IT)

(73) Assignee: EBFOIL, S.R.L., Bologna (IT)

( * ) Notice: Subject to any disclaimer, the term of this patent is extended or adjusted under 35 U.S.C. 154(b) by 439 days.

(21) Appl. No.: 14/405,396

(22) PCT Filed: May 29, 2013

(86) PCT No.: PCT/IB2013/054433
§ 371 (c)(1),
(2) Date: Dec. 3, 2014

(87) PCT Pub. No.: WO2013/182954
PCT Pub. Date: Dec. 12, 2013

(65) Prior Publication Data
US 2015/0144180 A1  May 28, 2015

(30) Foreign Application Priority Data

Jun. 5, 2012 (IT) ................ VI2012A0133
Jul. 13, 2012 (IT) ................ VI2012A0169
Oct. 12, 2012 (IT) ................ VI2012A0267

(51) Int. Cl.
*H01L 31/049* (2014.01)
*H01L 31/05* (2014.01)
(Continued)

(52) U.S. Cl.
CPC ............ *H01L 31/049* (2014.12); *B32B 3/266* (2013.01); *B32B 7/12* (2013.01); *B32B 27/306* (2013.01);
(Continued)

(58) Field of Classification Search
CPC ... H01L 31/049; H01L 31/0516; H01L 31/18; H01L 31/048; H01L 31/02245
See application file for complete search history.

(56) References Cited

U.S. PATENT DOCUMENTS 5,972,732 A   10/1999  Gee et al. ................ 438/66
6,245,987 B1 * 6/2001  Shiomi ............ H01L 31/048
                                            136/244
(Continued)

FOREIGN PATENT DOCUMENTS

FR      2877144         4/2006
WO   WO 2008/080160     7/2008
(Continued)

OTHER PUBLICATIONS

Conley B. et al, ENLITE Polyolefin Back Encapsulant Composite Films, Aug. 27, 2012, pp. 1-4; Dow Chemical Company.
(Continued)

*Primary Examiner* — Golam Mowla
(74) *Attorney, Agent, or Firm* — Fattibene and Fattibene LLC; Paul A. Fattibene

(57) ABSTRACT

The present invention provides for a multi-layered structure adapted to be applied to the surface of a back-contact back-sheet for a photovoltaic module comprising back-contact solar cells. The multi-layered structure comprises a non-extendible intermediate layer (240) comprised of a dielectric material. The multi-layered structure further comprises an upper layer (280) of an encapsulating material coupled to the upper surface (242) of the intermediate layer, as well as a lower layer (270) of a thermo-adhesive material coupled to the lower surface (244) of the intermediate layer (240). The multi-layered structure also has a plurality of through-holes pierced at predetermined positions.

30 Claims, 9 Drawing Sheets

(51) Int. Cl.

| | | |
|---|---|---|
| *H01L 31/18* | (2006.01) | |
| *B32B 7/12* | (2006.01) | |
| *B32B 27/30* | (2006.01) | |
| *B32B 3/26* | (2006.01) | |
| *H01L 31/0224* | (2006.01) | |
| *H01L 31/048* | (2014.01) | |

(52) U.S. Cl.
 CPC ...... *H01L 31/02245* (2013.01); *H01L 31/048* (2013.01); *H01L 31/0516* (2013.01); *H01L 31/18* (2013.01); *B32B 2307/204* (2013.01); *Y02E 10/50* (2013.01); *Y10T 156/1057* (2015.01)

(56) References Cited

U.S. PATENT DOCUMENTS

| | | | | |
|---|---|---|---|---|
| 7,342,171 | B2* | 3/2008 | Khouri | E04D 5/00 136/245 |
| 9,306,103 | B2* | 4/2016 | Natarajan | H01L 31/0516 |
| 2008/0216887 | A1 | 9/2008 | Hacke et al. | 136/244 |
| 2010/0024881 | A1 | 2/2010 | Hacke et al. | 136/256 |
| 2010/0151180 | A1 | 6/2010 | Bravet et al. | 428/76 |
| 2011/0126878 | A1 | 6/2011 | Hacke et al. | 136/244 |
| 2011/0192826 | A1 | 8/2011 | Von Moltke et al. | 219/121.64 |
| 2012/0204938 | A1 | 8/2012 | Hacke et al. | 136/246 |
| 2015/0280039 | A1* | 10/2015 | Baccini | H01L 31/0516 438/66 |

FOREIGN PATENT DOCUMENTS

| | | |
|---|---|---|
| WO | WO 2012/107655 | 8/2012 |
| WO | WO 2013/006687 | 1/2013 |

OTHER PUBLICATIONS

Rosca, Systematic reliability studies of back-contact photovoltaic modules, Aug. 12, 2012, vol. 8472, Proceedings of the SPIE—The International Society for Optical Engineering. (Abstract).

Italian Search Report in corresponding application IT VI20120132, dated Aug. 30, 2012, 12 pages.

Italian Search Report in corresponding application IT VI20120133, dated Aug. 31, 2012, 9 pages.

Italian Search Report in corresponding application IT VI20120267, dated Sep. 13, 2013, 10 pages.

* cited by examiner

ENCAPSULATING LAYER ADAPTED TO BE APPLIED TO BACK-SHEETS FOR PHOTOVOLTAIC MODULES INCLUDING BACK-CONTACT CELLS

TECHNICAL FIELD

The present invention relates to the field of photovoltaic modules. In particular, the present invention relates to the field of back-contact back-sheets used in photovoltaic modules.

Yet more in detail, the present invention relates to a multi-layered system to be applied to the surface of a back-contact back-sheet during assembly of a photovoltaic module and a process for producing such a multi-layered system.

STATE OF THE ART

Solar cells are used for converting solar light into electrical energy by means of the photovoltaic effect. Solar cells are, thus, one of the most promising alternative energy sources for replacing fossil fuels. Solar cells are formed by semiconductor materials and assembled so as to form so called photovoltaic modules, which are in turn grouped in order to form photovoltaic plants to be typically installed on building roofs or the like.

In order to form a photovoltaic module, groups of solar cells, grouped in series through appropriate electrical conductors called "ribbons", are typically encapsulated by means of an encapsulating material such as for example polyethylene (PE) with a high content of vinyl acetate, commonly known as EVA. The encapsulating material enclosing the solar cells is then inserted between a surface layer and a base layer or back-sheet, so as to complete the photovoltaic module.

The surface layer, or main surface of the module, typically made of glass, covers the surface of the module exposed to the sun and allows the solar light to reach the cells. On the other hand, the back-sheet carries out a multiplicity of tasks. It guarantees protection of the encapsulating material and of the solar cells from environmental agents, while simultaneously preventing the electrical connections from oxidizing. In particular, the back-sheet prevents moisture, oxygen and other factors depending on the atmospheric conditions from damaging the encapsulating material, the cell and the electrical connections. The back-sheet also provides for electrical insulation for the cells and the corresponding electrical circuits. Furthermore, the back-sheet has to have a high degree of opacity due to esthetic reasons and high reflectivity in the part oriented toward the sun for functional reasons.

Traditional photovoltaic modules are comprised of a plurality of layers. The lower layer is comprised of the back-sheet, upon which a first encapsulating layer comprising EVA is arranged. The cells are then laid down onto the encapsulating layer so as to form strings, wherein the cells are connected in series with each other by means of ribbons. Adjacent strings are then connected through two or more connections called "busbars". A second encapsulating layer is then arranged on top of the cells and a glass is finally placed onto the second encapsulating layer.

The electrical connection in photovoltaic modules comprising traditional solar cells occurs on both the front and the rear side of the cell. The electrical connection to the electrode on the front side of the cell, i.e. the side exposed to the light radiation, is traditionally implemented by means of a series of substantially parallel wire-like contacts called "fingers", which are connected by means of two or more ribbons transversally arranged with respect to the longitudinal direction of the fingers. This manner of contacting the front electrode, also known as "H-patterning", causes shading problems of the surface exposed to the light radiation due to the presence of the fingers and of the ribbons, which screen the light incident on the front surface of the cell.

Traditional electrical contacts thus causes the efficiency of the cells and solar modules to decrease. Furthermore, cells must be sufficiently far apart from each other, since the ribbons have to have enough space for being bent when passing from the upper side of a cell to the lower side of the adjacent one. Moreover, since adjacent strings of cells have to be connected, busbars have to have enough space also between adjacent cells strings.

In order to solve these problems, the family of solar cells called "back-contact cells" has been implemented. This family comprises the following types of solar cells: Interdigitated Back-Contact cells (IBC), Emitter Wrap Through cells (EWP), Metallization Wrap Through cells (MWT).

Back-contact cells are advantageous since they allow the contact with both electrodes of the cell to be transferred to the rear side of the cell, i.e. onto the side not exposed to the light radiation. This reduces the shading effect, thereby permitting an increase of effective surface of the cell exposed to the radiation, due to the absence of ohmic contacts on the outer surface of the cell. A further advantage with the use of back-contact cells lies in the fact that the process of assembling the module may be dramatically automated, while eliminating the process stage of connecting in series the cells within a string. Furthermore, since connections through ribbons and busbars do not have to be provided for, the thickness of the encapsulating layers may be reduced resulting in advantages related to an increased transparency to light and reduced costs. Among the various families of back-contact cells, MWT cells turn out to be particularly efficient and easy to implement. FIGS. 1a and 1b show the front surface (i.e. the surface exposed to the light radiation) and the rear surface of an MWT cell, respectively. On the other hand, FIG. 2 shows a cross section of an MWT cell.

An MWT cell is produced starting from a wafer doped so as to obtain a junction between an area 662 with free charges of a given polarity and an area 664 with free charges of the opposite polarity. For example, area 662 may be doped with n-type doping agents and area 664 with p-type doping agents. The junction lies on a plane which is generally parallel to the front and rear surfaces of the wafer.

As shown in FIGS. 1b and 2, the electrode corresponding to area 664 is contacted by means of electrical contact 640 formed directly on the rear side of the cell. On the other hand, the electrode corresponding to area 662 is contacted by means of electrical contact 620 which comprises several portions. As shown in FIGS. 1a and 2, portion 622 of the contact 620 with electrode 662 is formed on the front side of the cell and comprises a metal-semiconductor junction allowing the charge within electrode 662 to be collected. This charge is then transferred to the rear portion 624 of contact 620, arranged on the rear side of the cell. The charge transfer occurs through portion 626 of contact of contact 620, formed within a through hole extending across the wafer thickness. In this manner, the presence of the ribbons on the front surface of the cell is not necessary, which results in an increase of efficiency with respect to the traditional architecture of a solar cell.

FIG. 1b shows that cell 600 represented in the figure comprises, on the rear side of cell 600, 15 contacts 640 to the electrode of a given polarity and 16 contacts 624 to the electrode of the opposite polarity. Therefore, 31 ohmic contacts are present on the rear surface of cell 600. Back contact cells pose new technological problems concerning the design and the structure of the modules adapted to accommodate them. For example, the back-sheet has to be designed so as to support the connecting circuit onto which connections to both electrodes (base and emitter) of the cell are brought. One of the solutions to this problem is the so called back-contact back-sheet, which is an evolution of the traditional back-sheet in which the connecting circuit is implemented directly on the surface of the back-sheet facing the cell. The structure of the back-contact back-sheet will be described more extensively in the following.

In FIG. 3 the structure of a photovoltaic module comprising back-contact solar cells is shown. Back-contact cell 600 is arranged between an upper encapsulating material layer 450 and a lower encapsulating material layer 400. Cell 600 and encapsulating material layers 400 and 450 are then enclosed between a surface layer 800 typically made of glass or of a transparent and antireflective material and the back-sheet 200, which may be a back-contact back-sheet.

In FIG. 3 there are visible the paths of electrically conductive material making up the connecting circuit to the electrodes of the solar cell. If back-sheet 200 is a back-contact back-sheet, the connecting circuit is formed directly on the surface of the lower-lying insulating substrate and is firmly fixed thereto. The connecting circuit is used so as to ensure an electric contact with both electrodes (i.e. with the base and the emitter) of solar cell 600. In particular, the paths of electrically conductive material are provided with pads 222 marking the points of the connecting circuit which are to be electrically connected with a contact to one of the electrodes formed on the surface of cell 600.

The procedure of assembling a photovoltaic module such as that shown in FIG. 3 is typically performed in the manner described in the following.

The lower encapsulating material layer 400 to be arranged between the cell 600 and the back-contact or back-contact back-sheet 200 is pierced so that, after the module has been completed, the holes formed in the lower encapsulating layer 400 correspond to areas where pads 222 for contact with the electrodes are arranged. The pierced encapsulating material layer 400 is then laid on top of a back-sheet or back-contact back-sheet 200, so that the holes of the lower encapsulating material layer 400 correspond or are aligned to pads 222, in such a way as to leave pads 222 exposed toward the outside.

A lump or drop of an electrically conductive material is then deposited onto pads 222 of the conductive paths of the connecting circuit formed on the surface of the back-sheet or of the back-contact back-sheet 200. The surface of pads 222 is left exposed by the holes of the lower encapsulating material layer 400. The conductive material deposited onto pads 222 may for example comprise a conductive paste of the type knows as "Electro Conductive Adhesive" (ECA).

Subsequently, the cells 600 to be embedded in the module are placed onto the lower encapsulating material layer 400 so that each contact element with the electrodes formed on the rear surface of the cell comes into contact with a lump of conductive paste applied to one of the pads 222 and exposed to the contact with cell 600 through one of the holes of the lower encapsulating material layer 400. The upper encapsulating material layer 450 is then placed onto the upper surface of the cell 600, opposite the rear surface in contact with the conductive paste applied to pads 222. Finally, a layer 800 of a transparent and antireflective material is laid onto the upper encapsulating material layer 450.

After the structure has been prepared as described above, this can be turned upside down and subsequently laminated in vacuum at a temperature between 145° C. and 165° C. for a time interval variable between 8 and 18 minutes.

FIG. 4a shows the structure of the module before the lamination process. The components of the module, stacked as previously described, are singularly distinguishable. In particular, FIG. 4a shows a stack comprising, starting from the bottom and moving towards the top of the figure, the back-sheet or back-contact back-sheet 200 with conductive pads 222 upon which conductive paste 300 has been applied, the lower encapsulating material layer 400, the cell 600, the upper encapsulating material layer 450 and surface layer 800.

FIG. 4b schematically shows the structure of the module after the lamination process has taken place. During the first lamination stage, the structure is arranged into a vacuum chamber from which the air is evacuated by means of pumps. A pressure is then applied to the structure so as to compact the layers of which the photovoltaic module structure is comprised while simultaneously maintaining a vacuum in the area in which the module is situated. The whole cycle has preferably a total duration less then 18 minutes. The cycle preferably occurs at a temperature between 140° C. and 165° C.

The lamination results in the hardening of the conductive paste 300 through its polymerization, thus causing cells 600 to attach to back-sheet 200. Furthermore, a task of the lamination process is also causing melting and subsequent polymerization of the upper and lower encapsulating material layer 450 and 400. In this manner, the encapsulating material of the lower layer 400, by melting, fills all void spaces between the conductive paste 300, the back-sheet or back-contact back-sheet 200 and the rear surface of cells 600. Furthermore, after polymerizing, the upper encapsulating material layer 450 exerts also an adhesive action between the surface layer 800 and outer surface of cell 600 in contact with upper encapsulating material 450. Analogously, the lower encapsulating material layer 400, after polymerizing, exerts also an adhesive action between the rear surface of cells 600 and back sheet 200.

The description given above stresses the technical challenges encountered when producing a photovoltaic module.

First of all, piercing a plurality of holes in a sheet of encapsulating material such as EVA is not a trivial task, specially if the holes have to have predetermined positions and the error tolerance on the positioning must be reduced down to about 0.1 mm over total dimensions of 1700 mm×1000 mm. The tolerance degree is so low since each hole of lower encapsulating material layer 400 must correspond to one of the pads 222 for the contact to the connecting circuit. Consequently, the pattern formed by the holes in the encapsulating material layer 400 must exactly correspond to the pattern formed by pads 222.

It should be further considered that the foil of encapsulating material has the same dimensions as the module, i.e. typically 1.7 m×1 m. This considerable dimensions may render the piercing operation even harder. Moreover, the encapsulating layer does not typically have a mechanical stability and has high thermal expansion/reduction coefficients limiting its dimensional stability. For example, when undergoing a tensile stress, a sheet or a foil of encapsulating material tends to extend in a viscoelastic manner. This feature of the encapsulating material typically renders the piercing operation even harder.

Furthermore, the number of holes to be pierced is extremely large. As previously described with reference to FIG. 1b, 16 contacts to an electrode and 15 contacts to the other electrode are typically formed on the rear side of an MWT cell. A photovoltaic module usually includes 60 or 72 cells. Thus, the number of holes to be pierced into the encapsulating material layer is equal to 1860 and 2232 in the case of a module with 60 and 72 cells, respectively. Piercing the holes is hence a rather long and complex task, which contributes to increasing production costs.

An extremely delicate operation when producing photovoltaic modules is then aligning the pierced lower encapsulating material film 400 with the underlying back-sheet or back-contact back-sheet 200, on whose conductive pads 222 the conductive paste is to be applied. Indeed, each hole in lower encapsulating material layer 400 must exactly correspond to the respective conductive pad 222. The margin of error while aligning the lower encapsulating material 400 and the back-sheet or back-contact back-sheet is tiny. The reason for this small margin of error is that a misalignment between the holes in the encapsulating material layer and the conductive pad 222 may likely cause conductive pads 222 to be covered by the encapsulating material layer 400 and, hence, the contact between one of the electrodes of cell 600 and the back-sheet or back-contact back-sheet 200 to fail. Even worse, a misalignment between the holes in encapsulating layer 400 and conductive pads 222 may cause, during subsequent assembling stages of the photovoltaic module, the conductive paste to diffuse from conductive pads 222 to undesired areas of the surface of back-sheet or back-contact back-sheet 200 facing the cells.

Even if the holes of lower encapsulating material layer 400 could be exactly aligned to conductive pads 222 on back-sheet or back-contact back-sheet 200, a serious problem arises during the subsequent phases of module assembly procedure. This is due to the fact that the position of the lower encapsulating material layer 400 with respect to back-contact or back-contact back-sheet 200 should remain unaltered during the subsequent stages of assembly procedure comprising: deposition of cells 600, deposition of upper encapsulating material layer 450, deposition of surface layer 800 and, finally, lamination.

It might well occur that the structure to be assembled is to be moved from a point to another one of the production line when passing from one of the assembly stages mentioned above to the next one. Furthermore, a lower encapsulating material layer 400 may laterally shift with respect to back-sheet 200 when the upper encapsulating material layer 450 or the surface layer 800 are introduced into the structure as a result of the stress undergone by the structure during the deposition process. It should be also pointed out that during lamination the encapsulating material layer 400 may deform by expanding or contracting in reply to a temperature increase. Therefore, maintaining the position of the lower encapsulating material 400 constant with respect to back-sheet or back-contact back-sheet 200 is a non-trivial task which a producer of photovoltaic modules may not elude by using tools available from the state of the art.

In view of the problem mentioned above and of the drawbacks related to the traditional procedure of assembling photovoltaic modules, an object of the present invention is to provide a component for photovoltaic modules to be applied to the surface of a back-contact back-sheet for photovoltaic modules and a method of producing such a component which enable overcoming said problems.

In particular, one of the objects of the present invention is to provide a multi-layered structure comprising a dielectric material layer and an encapsulating material layer to be applied to the surface of a back-contact back-sheet for photovoltaic modules in such a way as to allow the photovoltaic module to be assembled in a convenient, cost-effective and precise manner.

A further object of the present invention is to provide a multi-layered structure and a method for its implementation by which an excellent degree of stability of the lower encapsulating material layer may be achieved during the various stages of manufacturing of the photovoltaic module, in such a way that the encapsulating material layer may not move during manufacturing of the module.

A further object of the present invention is to provide a multi-layered structure and a method for implementing it by which a greater precision in the final and intermediate structure of the photovoltaic module may be achieved, thereby enabling a high degree of process repeatability and reducing to a minimum the waste of resources due to flawed products.

A further object of the present invention is to provide a multi-layered structure and a method for implementing it by which the risks related to conductive paste contamination or undesired diffusion may be eliminated when assembling a photovoltaic module.

A further object of the present invention is to provide a multi-layered structure and a method for implementing it by which the inconvenient and complex process step of piercing the lower encapsulating material layer during manufacturing of the photovoltaic module may be simplified by means of an industrial and repeatable method.

The critical process steps of piercing the lower encapsulating material layer and aligning the encapsulating material layer to the back-contact back-sheet are usually carried out by the producer of photovoltaic modules. Therefore, a further object of the present invention is to provide a multi-layered structure which is adapted to be applied to the surface of a back-contact back-sheet and is capable to release a producer of photovoltaic modules from the tasks of piercing and aligning the encapsulating material layer, thereby simplifying and optimising the process of assembling and/or producing solar modules.

BRIEF DESCRIPTION OF THE INVENTION

According to the present invention, a multi-layered structure adapted to be applied to the surface of a back-contact back-sheet for a photovoltaic module is provided based on the new and inventive concept that the manufacturing process of photovoltaic modules may be simplified, speeded up and rendered more precise if the lower encapsulating material layer is provided together with a dielectric material layer previously treated so that the encapsulating material layer may be firmly fix to one of its surfaces.

The present invention is also based on the new and inventive concept that a layer of a thermo-adhesive resin may be applied to the surface of the dielectric material opposite the surface onto which the encapsulating material layer is fixed, so as to allow the dielectric material layer to steadily adhere to the surface of the back-contact back-sheet onto which the multi-layered structure is applied.

Preferred embodiments of the present invention are provided by the dependent claims and the following description.

The present invention also provides a method of producing a multi-layered structure adapted to be applied to the surface of a back-contact back-sheet for a photovoltaic module according to an embodiment of the invention and in the following description.

BRIEF DESCRIPTION OF THE FIGURES

Further features and advantages of the present invention will appear more clearly from the following description of the embodiments of the device and method according to the present invention shown in the figures. In the figures identical and/or similar and/or corresponding parts are identified by the same reference numerals or letters. In particular, in the figures.

DETAILED DESCRIPTION

In the following, the present invention will be described with reference, to particular embodiments as shown in the attached figures. However, the present invention is not restricted to the particular embodiments described in the following detailed description and shown in the figures. Rather, the described embodiments simply show several aspects of the present invention whose scope is defined by the claims.

Further modifications and variations of the present invention will be clear for the person skilled in the art. As a consequence, the present description is to be considered as comprising all modifications and/or variations of the present invention, whose scope is defined by the claims.

Figure 5:
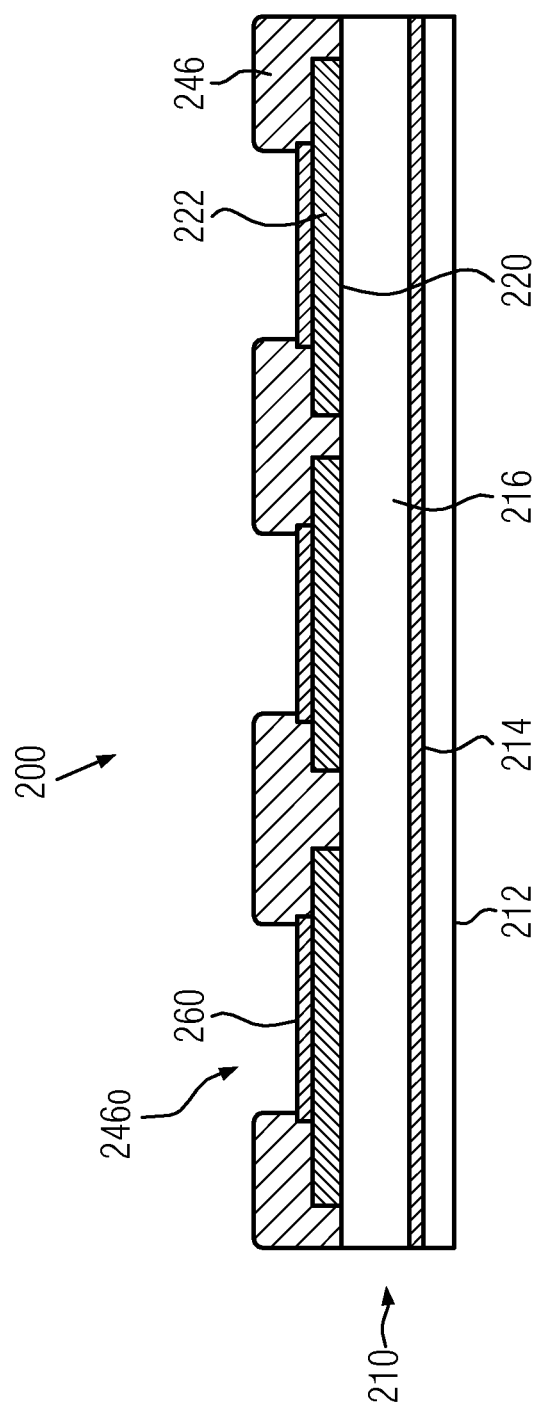
FIG. 5 shows a cross section of a back-contact back-sheet of a conventional type.

FIG. 5 schematically shows a back-contact back-sheet 200 for a photovoltaic module commonly used in the state of the art. The air-side of the photovoltaic module is the side at the bottom of FIG. 5, below the back-contact back-sheet 200 shown therein.

Back-contact back-sheet 200 comprises an insulating complex or substrate 210 exposed to the air-side of the photovoltaic module.

Insulating substrate 210 comprises a first insulating layer 212, an intermediate layer 214 and a second insulating layer 216.

The first insulating layer 212 has a surface exposed toward the air-side of the photovoltaic module and is used as a barrier against moisture, UV rays, oxygen and other external environmental agents which might penetrate into the module, thereby damaging some constituent parts thereof or causing the polyurethane-like or polyester-like adhesive to degrade and turn yellow.

The inner surface of the first insulating layer 212, opposite the surface exposed to the air-side, faces the intermediate layer 214, which acts as a barrier against moisture and water vapour. Intermediate layer 214 is typically comprised of aluminium, preferably with a thickness between 8 and 25 micrometers.

The inner surface of intermediate layer 214, opposite the surface facing first insulating layer 212, then faces the second insulating layer 216, acting as an electrical insulator and a further barrier. An electrically conductive material layer 220 is then applied to the inner surface of second insulating layer 216, opposite the surface of the second insulating layer 216 facing the intermediate layer 214. Electrically conductive material layer 220 applied to the surface of the second insulating layer 216 will subsequently be processed so as to form a pattern comprising in general elongated electrically conductive elements such as paths, tracks, etc. Such a pattern forms the connecting circuit to the electrodes of the solar cells.

The connecting circuit is not formed in electrically conductive layer 220 as a continuous layer on the inner surface of the second insulating layer 216. Hence, the connecting circuit usually leaves exposed portions of the inner surface of the second insulating layer 216 onto which it is applied. The connecting circuit may be formed in the electrically conductive material layer 220 by means of one of the techniques commonly used for producing printed circuit boards. For example the connecting circuit may be formed in the conductive layer 220 by means of optical lithography. Alternatively, the connecting circuit may be formed on the conductive material by means of an ablation process, to be achieved by mechanical means such as a milling machine or by evaporation using for example a laser.

Figure 1B:
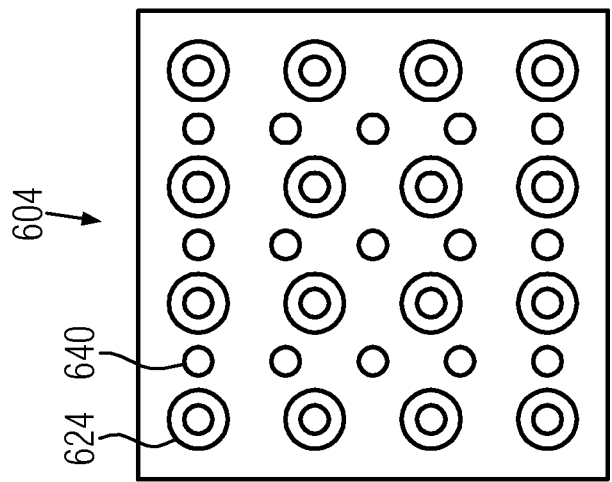
FIG. 1b shows a top view of the inner or rear surface of a solar cell of the MWT type.
Figure 1A:
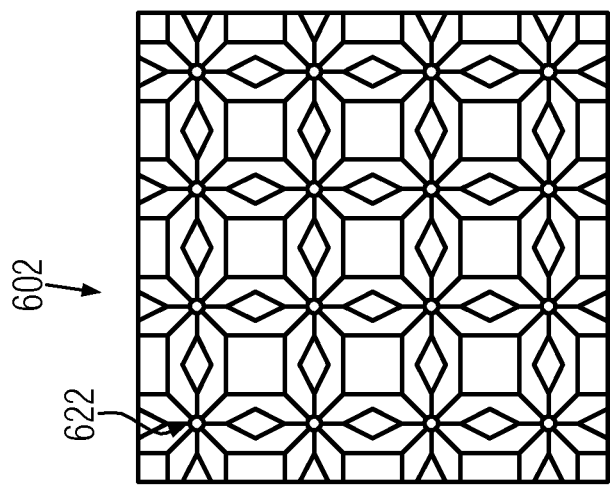
FIG. 1a shows a top view of the outer or front surface a solar cell of the MWT type.
Figure 2:
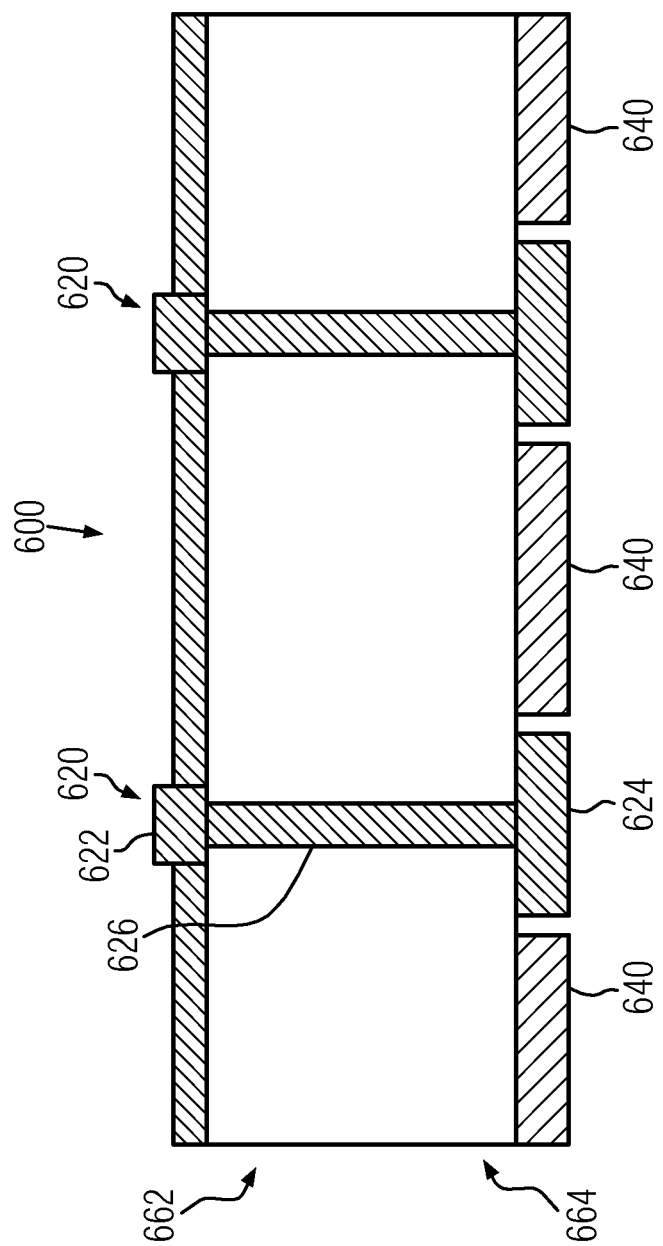
FIG. 2 shows a cross section of a solar cell of the MWT type.

Conductive layer 220 further comprises pads 222 formed in predetermined positions of the pattern of which the connecting circuit in electrically conductive layer 220 is comprised. Pads 222 are adapted to be brought into electrical contact with the ohmic contacts formed on the surface of the electrodes of the solar cells by means of a lump of conductive material. Pads 222 thus ensure the electrical contact with the solar cells mounted in the photovoltaic module. Pads 222 are preferably formed in positions corresponding to the positions of ohmic contacts 624 and 640 formed on the rear side of the solar cells 600 and shown in FIGS. 1b and 2.

Still with reference to FIG. 5, back-contact back-sheet 200 further comprises a dielectric material layer 246 deposited onto the inner side of back-contact back-sheet 200, i.e. onto the side facing the cells and opposite the air-side. Dielectric material layer 246 is usually formed, for example by means of a screen printing process, so that the dielectric material entirely covers the portions of the surface of second insulating layer 216 left exposed by conductive layer 220 applied thereupon. Dielectric material layer 246 thus accomplishes the task of electrically insulating two adjacent elements or pads of the pattern formed by conductive layer 220 which are electrically disconnected with each other. Furthermore, dielectric material layer 246 also performs the task of hindering or neutralizing surface currents which might possibly flow on the surface of substrate 210 upon which electrically conductive material layer 220 and a portion of dielectric material layer 246 are fixed.

Dielectric material layer 246 is deposited so as to leave conductive layer 220 partially exposed. More specifically, dielectric material layer 246 is provided with openings 246o situated in correspondence to pads 222 shown in FIGS. 3 to 5 and used for contacting the electrodes of the photovoltaic cells. Thus, dielectric layer 246 leaves conductive pads 222 exposed toward the inner side of back-contact back-sheet 200, i.e. toward the side facing the cell.

Finally, the portions of conductive layer 220 left exposed by dielectric material layer 246 are covered by a protective layer 260 so as to prevent the exposed surface of electrically conductive material 220 from being oxidised, corroded, scratched or damaged in general.

Protective layer 260 may comprise an organic material, which is generally deposited through screen printing. Alternatively, the exposed portions of conductive layer 220 may be protected by a metallic film originally applied to the exposed surface. For example, if electrically conductive material layer 220 comprises copper, it can be protected by means of a thin nickel film deposited onto the surface of the conductive material layer 220 comprising copper. If layer 220 is made of aluminium, it can be plated with copper and subsequently nickel or tin. The choice of aluminium would be competitive with copper due to lower costs against equal or comparable electrical resistivity.

Back-contact back-sheet 200 shown in FIG. 5 entails the drawbacks previously described, so that the subsequent stages of mounting the photovoltaic module turn out to be slow, expensive and inaccurate. This is mainly due to the fact that a layer of encapsulating material arranged between the cells and the back-contact back-sheet is to be first pierced and then kept perfectly aligned with conductive pads 222 of the back-contact back-sheet during all assembly stages.

Figure 6:
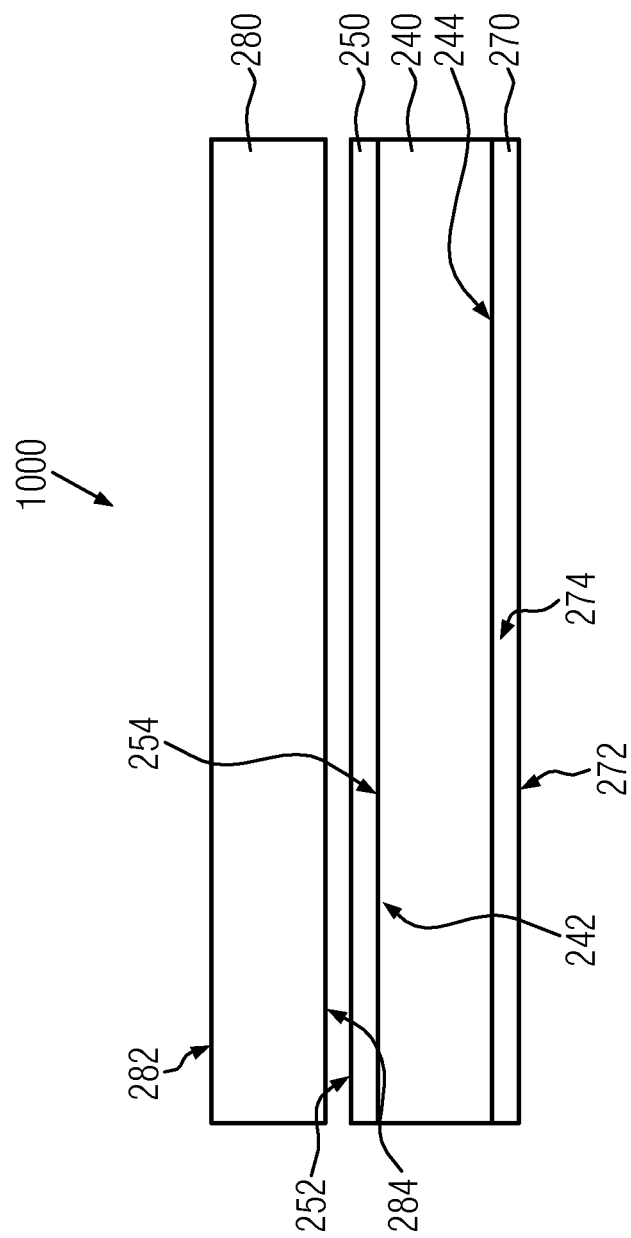
FIG. 6 shows a cross section of an intermediate stage during manufacturing of a multi-layered structure according to an embodiment of the present invention.

In order to overcome the drawbacks related to back-contact back-sheets known from the state of the art, a multi-layered structure 1000 is hereby proposed, whose constituent parts are shown in FIG. 6. The multi-layered structure according to an embodiment of the present invention shown in FIG. 6 is adapted to be applied to the surface of a back-contact back-sheet. The back-contact back-sheet on the surface of which structure 1000 is applied comprises, analogously to that shown in FIG. 5, an insulating substrate 210 and an electrically conductive material layer 220 fixed to the inner surface of substrate 210 and formed as a connecting circuit to the electrodes of solar cells 600. Unlike the back-contact back-sheet shown in FIG. 5, the back-contact back-sheet on the surface of which structure 1000 is adapted to be applied, does not preferably comprise the dielectric material layer 246. Therefore, the surface of the back-contact back-sheet onto which the structure 1000 can be applied exposes the entire connecting circuit formed in conductive material layer 220. The exposed surface of electrically conductive material layer 220 may then be covered by a protective layer 260 as shown in FIG. 5 and as described with reference thereto.

Protective layer 260 is implemented in a novel way by means of structure 1000.

Structure 1000 shown in FIG. 6 comprises a dielectric material layer 240 which has an inner or upper surface 242 facing the inside of the photovoltaic module, and a lower or outer surface 244 facing the back-contact back-sheet onto which the structure 1000 can be applied. In the following, layer 240 will be equivalently referred to as "dielectric material layer" or as "intermediate layer".

Dielectric material layer 240 comprises a non-extendible thin film. According to an embodiment of the present invention, dielectric material layer 240 comprises a polymer. According to particular embodiments of the present invention, dielectric material layer 240 comprises polyethylene terephthalate (PET), polypropylene (PP), polyimide (PI), or other polymers which have pronounced characteristics of mechanical stability and dielectric rigidity. Preferably, dielectric material layer 240 may further comprise biaxially oriented PET or biaxially oriented PP. According to an embodiment of the present invention, dialectic material layer 240 has a thickness between 20 and 40 micrometers. Preferably, dielectric material layer 240 has a thickness between 23 and 36 micrometers.

A thermo-adhesive material layer 270 is fixed to the lower surface 244 of dielectric material layer 240. Thermo-adhesive material layer 270 guarantees adhesion of structure 1000 to the surface of the underlying back-contact back-sheet and is able to adapt according to different heights of the upper face of the back-contact back-sheet so as to fill all voids. In particular, thermo-adhesive layer 270 is adapted to adhere to the surface of conductive material layer 220 as well as to the portions of the surface of the insulating substrate left exposed by electrically conductive material layer 220. Thermo-adhesive material layer 270 comprises an inner or upper surface 274 facing dielectric material layer 240 and outer or lower surface 272 opposite the inner surface 274 and facing the back-contact back-sheet.

In the following, layer 270 will be equivalently referred to as "thermo-adhesive layer", or as "lower layer".

According to embodiments of the present invention, thermo-adhesive layer 270 comprises a resin. According to particular embodiments of the present invention, thermo-adhesive layer 270 may comprise a thermosetting resin or a thermoplastic resin. According to a particular embodiment of the present invention, thermo-adhesive material layer 270 comprises a resin chosen among epoxy, epoxy phenolic, co-polyester, polyurethane or polyolefin ionomer resins. According to a particular embodiment of the present invention, thermo-adhesive material 270, comprises a resin whose melting temperature is in the range of 60° C. to 160° C. Preferably, the resin of thermo-adhesive material layer 270 is non sticky when cold-processed.

According to a further embodiment of the present invention, thermo-adhesive material layer 270 comprises an encapsulating material. According to a particular embodiment of the present invention, thermo-adhesive material layer 270 comprises EVA. According to other embodiments of the present invention, thermo-adhesive material layer 270 comprises at least one of the following materials: silicones, ionomer resins, thermo-polyurethanes, polyolefins, thermopolyolefins, terpolymers grafted with maleic anhydride.

Using a layer 270 comprising an encapsulating material leads to advantages due to a high fluidity of layer 270 at lamination temperatures. This fluidity allows the material (e.g. EVA) of which layer 270 is comprised to fill the voids formed by the ablated portions of the conductive material layer, even when the thickness of layer 270 is small. Furthermore, encapsulation EVA, as well as ionomer resins, intrinsically have excellent adhesion properties when applied to metallic surfaces such as copper or aluminium.

Furthermore, the uniformity of materials between layer 270 and layer 280 results in a reduced chemical complexity of the structure.

Thermo-adhesive material layer 270 performs the task of fixing structure 1000 to the surface of the back-contact back-sheet onto which it is applied. In particular, thermo-adhesive material layer 270 ensures adhesion between dielectric material layer 240 and conductive material layer 220 wherein the connecting circuit is formed.

Structure 1000 further comprises an encapsulating material layer 280 comprising, in turn, an outer or lower surface 284 and inner or upper surface 282. In the following, layer 280 will be equivalently referred to as "encapsulating layer", "encapsulating material layer", or as "upper layer".

Encapsulating material layer 280 is applied to dielectric material layer 240 so that lower surface 284 of encapsulating material layer 280 faces upper surface 242 of dielectric material layer 240. According to an embodiment of the present invention, encapsulating material layer 280 comprises EVA. According to other embodiments of the present invention, encapsulating material layer 280 comprise at least one of the following materials: silicones, ionomer resins, thermo-polyurethanes, polyolefins, thermopolyolefins, terpolymers grafted with maleic anhydride. According to an embodiment to the present invention, encapsulating material layer 280 has a thickness between 100 and 500 micrometers.

Adhesion between dielectric material layer 240 and encapsulating material layer 280 is provided by a primer layer 250 applied to upper surface 242 of dielectric material layer 240. As will be described below, according to an embodiment, primer layer 250 results from a chemical or a physical surface treatment undergone by upper surface 242 of dielectric material layer 240.

Figure 7:
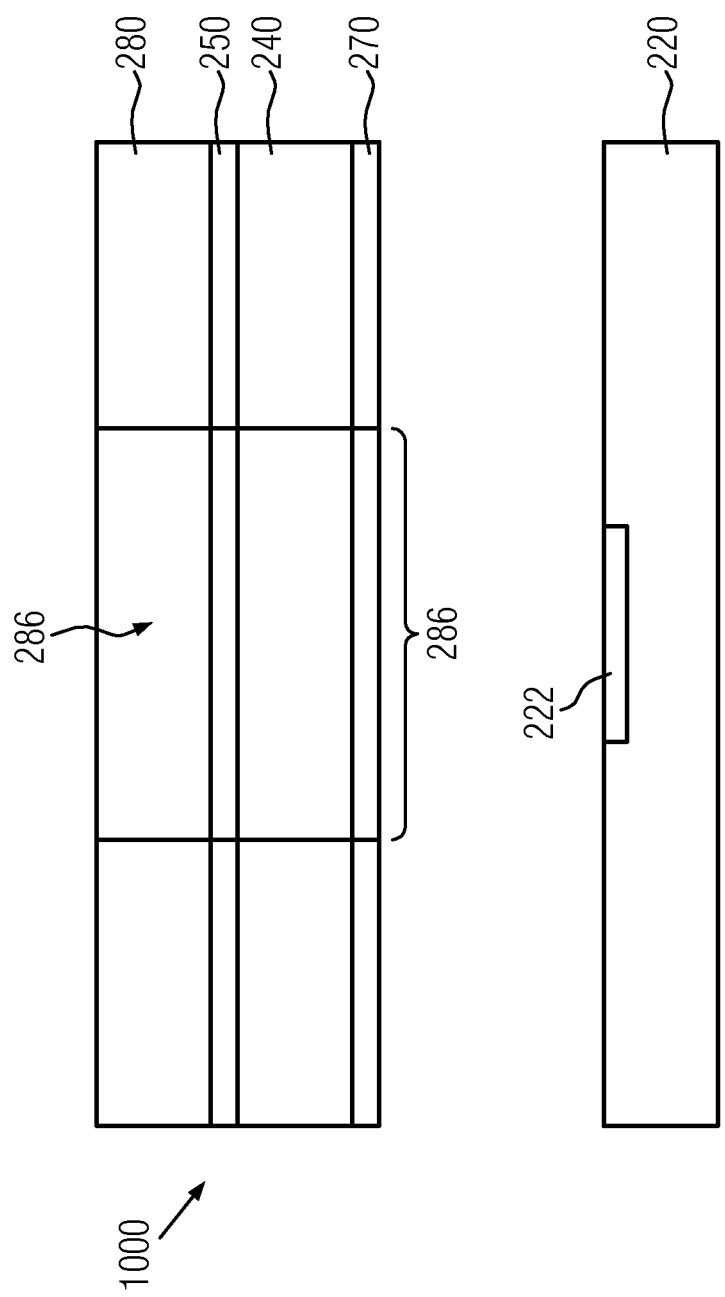
FIG. 7 shows a cross section of a system comprising a multi-layered structure according to an embodiment of the present invention and a portion of the back-contact back-sheet on the surface of which a multi-layered structure is applied.

As shown in FIG. 7, multi-layered structure 1000 is provided with a plurality of through holes 286. Through holes 286 are made in predetermined positions, each corresponding to a predetermined position on the connecting circuit formed in the electrically conductive material layer 220 of the back-contact back-sheet on the surface of which multilayered structure 1000 is to be applied. More specifically, holes 286 are such that, after multilayered structure 1000 has been aligned with the back-contact back-sheet, the position of each hole 286 corresponds to the position of one of the ohmic contacts 624 and 640 formed on the rear surface of the cells. Furthermore, after multilayered structure 1000 has been aligned and applied to the back contact back sheet, the position of the through holes 286 will form one of the contact points on the conductive material layer 220 indicated by the reference number 222 in Figures from 7 to 9. In this manner, after the multilayered structure 1000 has been applied to the back-contact back-sheet for which it is produced, holes 286 of multi-layered structure 1000 leave contact pads 222 on conductive material layer 220 exposed. It is hereby pointed out that the surface of conductive material layered 220, as well as the surface of contact pads 222, may be covered by the protective layer 260 shown in FIG. 5 but not in Figures from 6 to 9.

Figure 8:
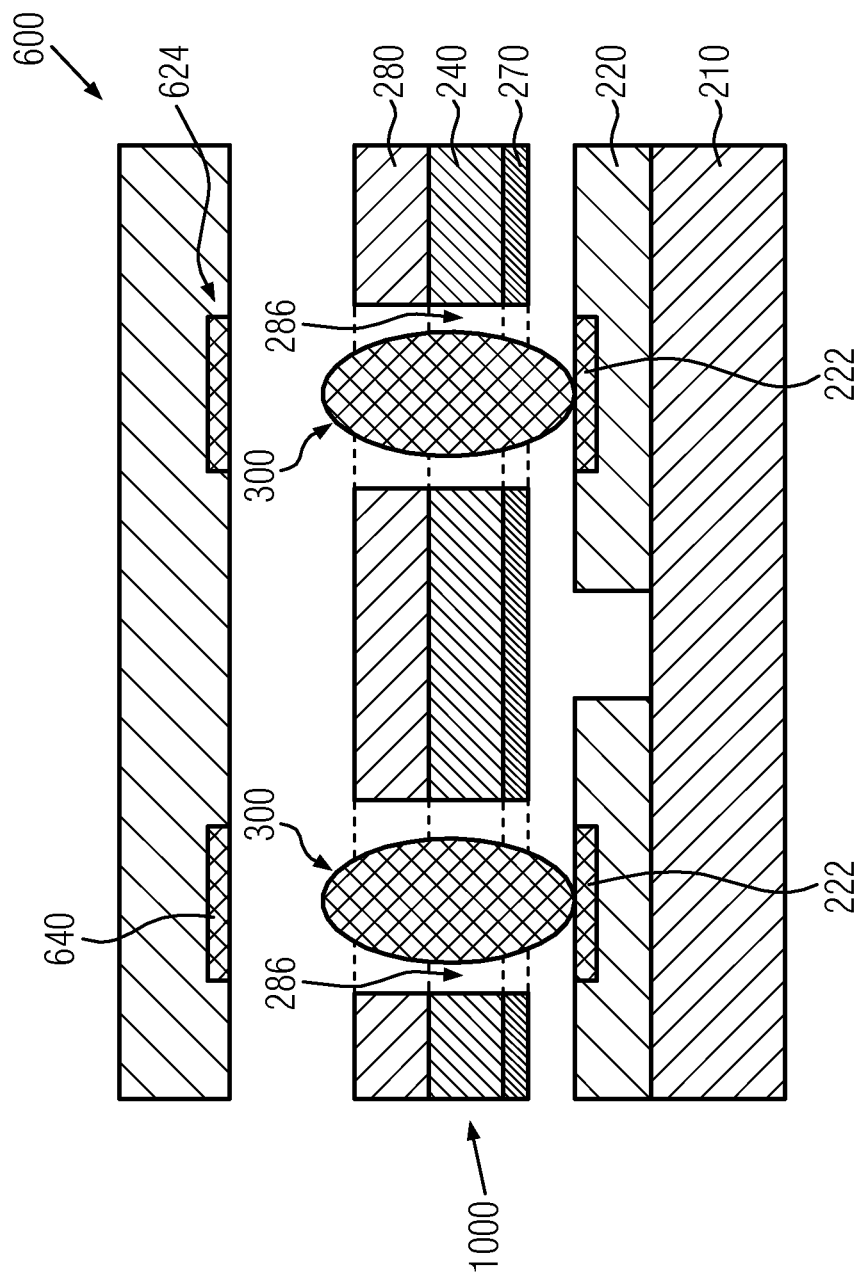
FIG. 8 shows a cross section of a system comprising a solar cell, a multi-layered structure according to an embodiment of the present invention and a back-contact back-sheet on the surface of which the multi-layered structure is applied.

Contact pads 222 on the back-contact back-sheet may thus be brought into electrical contact through holes 286 with ohmic contacts 640 or 624 on the rear surface of the cell 600. These ohmic contacts 640 and 624 may for example be formed on the positive electrode (p-contact) and on the negative electrode (n-contact) of photovoltaic cell 600, respectively, as also shown in FIG. 8.

Figure 3:
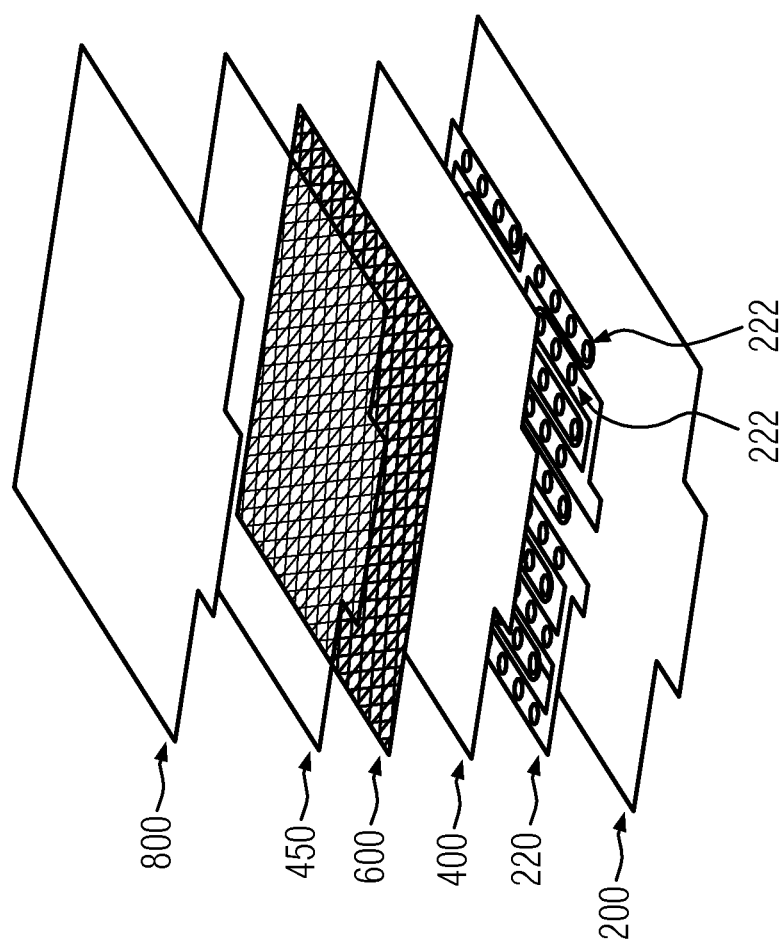
FIG. 3 shows an exploded view of a portion of a photovoltaic module.
Figure 4B:
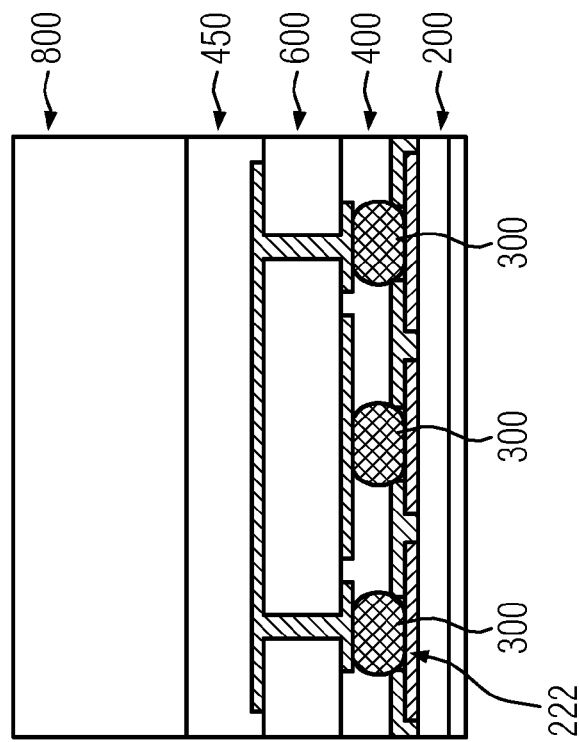
FIG. 4b shows the structure of a photovoltaic module after the lamination process.
Figure 4A:
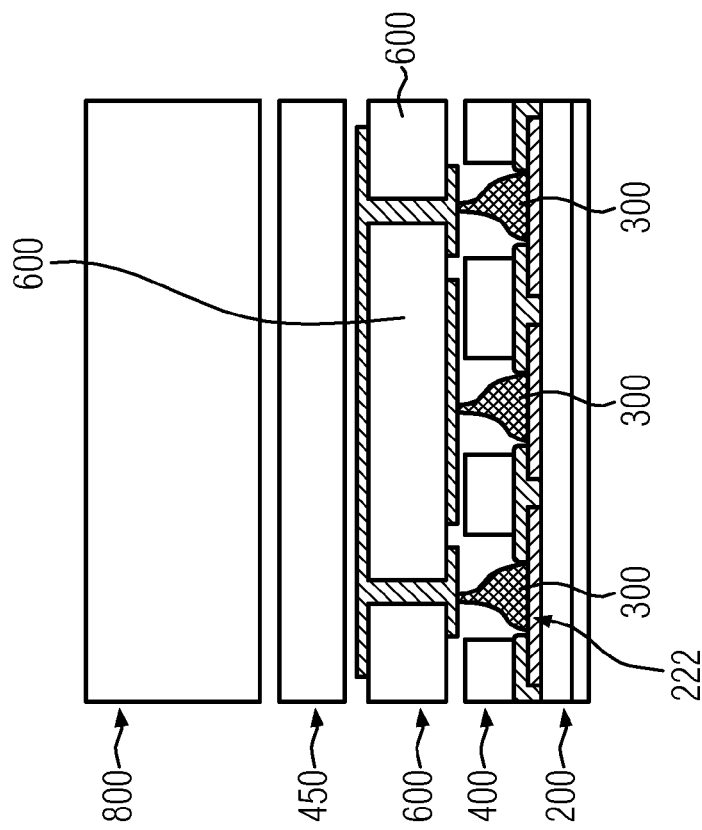
FIG. 4a shows the structure of a photovoltaic module before the lamination process.

Multi-layered structure 1000 shown in Figures from 6 to 9 provides for a pre-perforated structure having mechanical stability and which can easily be applied to a surface of a traditional back-contact back-sheet. This structure does not have to be aligned with pad 222 which, accordingly to the state of the art, would have previously been formed, thus reducing the range of uncertainty in the alignment of the structure with the back-contact back-sheet. Structure 1000 thus allows assembly operations of a photovoltaic module to be speeded up, simplified and made more precise, thanks to the fact that a producer of photovoltaic modules is freed from the task of perforating the encapsulating material layer arranged between the cells and the back-contact back-sheet. Furthermore, aligning structure 1000 with the back-contact back-sheet is much less critical than aligning a single encapsulating foil with a back-contact back-sheet upon which connection pads have been previously defined. Indeed, structure 1000 has to be aligned to the back-contact back-sheet so that trough holes 286 correspond to the paths making up the connecting circuit and not to pre-formed pads 222 shown for example in FIG. 3. The error margin in the alignment is that much larger than in the case in which connection pads 222 have been previously formed in the connecting circuit as openings in the dialectic layer deposited onto the surface of the back-contact back-sheet, as required by the prior art and as shown in FIGS. 3 and 5.

In the following some methods of producing multilayered structure 1000 according to embodiments of the present invention will be described.

With reference to FIG. 6, according to an embodiment of the present invention, one or more than one appropriate dielectric materials are chosen and dielectric material layer 240 is formed by means of the material or materials chosen.

According to the method according to the present invention, a choice is made of one or more materials or a combination of two or more materials chosen among thermo-adhesive or encapsulating material. After choosing the appropriate thermo-adhesive or encapsulating materials or the appropriate combination thereof, the thermo-adhesive or encapsulating material layer 270 is formed. The materials which may form lower layer 270 may be chosen among the thermo-adhesive or encapsulating materials listed above when describing lower layer 270.

According to the method according to the present invention, one or more encapsulating materials are then chosen and encapsulating or upper layer 280 is formed based on the encapsulating materials chosen. The encapsulating materials constituting upper layer 280 may be chosen from the list given above when describing upper layer 280.

Thermo-adhesive material layer 270 is then applied to lower surface 244 of dielectric material layer 240. This application may be performed by means of co-extrusion, hot-lamination, spin coating, or by means of a coupling achieved by using an adhesive.

According to a further embodiment of the present invention, not shown in the figures, thermo-adhesive material 270 may be fixed to dielectric material layer 240 by means of an intermediate adhesive placed between upper surface 274 of thermo-adhesive material layer 270 and lower surface 244 of dielectric material layer 240.

According to an embodiment of the method according to the present invention, intermediate layer 240 is formed before outer layers 270 and 280.

According to a particular embodiment of the method according to the present invention, outer layers 270 and 280 are applied to intermediate layer 240 by means of extrusion. In this case, layer 270 and/or layer 280 are deposited hot onto intermediate layer 240, which is kept at a much lower temperature than the depositing species. Typically, intermediate layer 240 is kept at room temperature during the deposition of layers 270 and 280 by extrusion. When extrusion is used, it is advantageous to perform a treatment of the surface of intermediate layer 240 upon which upper layer 280 and lower layer 270 are to be deposited by extrusion. This treatment may comprise applying a primer or a surface treatment such as a corona treatment or a plasma treatment, as described in the following.

More specifically, according to a particular embodiment of the invention, the method of producing multi-layered structure 100 further comprises a chemical or physical surface treatment of upper surface 242 of dielectric material layer 240 facing the inside of the photovoltaic module. The surface treatment is performed so as to guarantee a stable adhesion of layer 240 with encapsulating material layer 280 to be applied onto dielectric material layer 240.

According to embodiments of the present invention, the physical or chemical treatment undergone by upper surface 242 of dielectric material layer 240 comprises a corona treatment or a plasma treatment. According to other embodiments of the present invention, the physical or chemical treatment comprises a primer layer applied to upper surface 242 of dielectric material layer 240. According to a particular embodiment of the present invention, the primer layer comprises polyester, copolyester, or an acrylic polymer.

The surface treatment results in a layer 250 in contact with upper surface 242 of intermediate layer 240. More in detail, layer 250 resulting from the surface treatment comprises a lower surface 254 facing the intermediate layer 240 and upper surface 252 adapted to face upper layer 280 after multi-layered structure 1000 has been completed.

The surface treatment may be such as to guarantee an adhesion between dielectric material layer 240 and encapsulating material layer 280 strong enough to allow one to comfortably carry out the subsequent stages of manufacturing structure 1000 and assembling the photovoltaic module wherein structure 1000 has to be enclosed. However, the surface treatment to upper surface 242 of the electric material layer 240 does not have necessarily to guarantee the final adhesion between dielectric material layer 240 and encapsulating material layer 280, i.e. the adhesion force between the two layers after the solar module has been completed. Such a final adhesion may be achieved during a process stage wherein the solar module is assembled, for example during the lamination process previously described. In particular, the surface treatment may be such that the peeling force between dielectric material layer 240 and encapsulating material layer 280 may be in the range of 0.3 to 1 N/cm before multi-layered structure 1000 is assembled into the photovoltaic module wherein it is to be enclosed.

After applying a chemical or physical treatment to upper surface 242 of dielectric material 240, encapsulating material layer 280 is applied to dielectric material layer 240. The presence of the surface treatment performed on surface 242 of dielectric material layer 240 ensures an adhesion between layer 240 and 280. The encapsulating material layer 280 thus turns out to be firmly fixed to underlying dielectric material layer 240.

According to a further embodiment of the present invention, one or more than one of the surface treatments described above for upper surface 242 of intermediate layer 240 are applied to lower surface 244 of intermediate layer 240, before coupling lower layer 270 to intermediate layer 240. According to this embodiment, lower layer 270 may advantageously comprise one or more of the encapsulating materials of which upper layer 280 is comprised. Lower layer 270 is then applied to intermediate layer 240 after performing the surface treatment.

According to an embodiment of the present invention not shown in the figures, lower layer 270 is applied to lower surface 244 of intermediate layer 240 by means of an intermediate adhesive layer.

According to an embodiment of the present invention, the application of lower layer 270 intermediate layer 240 is such as to ensure an adhesion strong enough to allow one to comfortably carry out the subsequent stages of fabrication of structure 1000 and assembly of the photovoltaic module wherein the structure is to be enclosed. However, the application of lower layer 270 to intermediate layer 240 does not necessarily have to guarantee the final adhesion between layers 240 and 270, i.e. the adhesion strength between the two layers 240 and 270 after the solar module has been completed. Such a final adhesion may indeed be achieved during a process stage wherein the solar module is assembled, for example during the lamination process previously described.

According to a further embodiment of the present invention, layers 270, 240 and 280 making up structure 1000 are simultaneously coextruded.

The process of production by coextrusion entails undeniable technical advantages in that, since the materials of the three layers 270, 240 and 280 are deposited in a semi-liquid form, they are spontaneously coupled with each other, thereby resulting in much stronger bonds than those which may be achieved using adhesive systems.

Furthermore, since adhesive systems are absent from the multi-layered structure according to this embodiment of the present invention, solvents and curing systems necessary for inducing polymerisation of adhesive system are not required.

Therefore, the process of producing the multi-layered structured 1000 according to this embodiment uses a technique of deposition by coextrusion.

Three extrusion outlets, or simply extruders, are used. Each extruder is connected to a corresponding tank containing a material of which one of the layers of multi-layered structure 1000 is comprised. The first, second and third tank contain the material or the mixture of materials of which upper layer 280, intermediate layer 240 and lower layer 270 are comprised, respectively. The extruders are aligned along a substantially vertical direction, i.e. along a direction substantially perpendicular with respect to a conventional horizontal plane corresponding to the ground plane. The extruders are thus arranged above one another. Starting from above, the first extruder is connected to the first tank. The second extruder is connected to the second tank and the third extruder is connected to the third tank.

The materials or material mixtures contained in the three tanks are liquefied and pushed outwards through the three extruders connected to the three tanks, respectively. After exiting from the extruders, the three materials or material mixtures combine with one another in their visco-liquid phase. After being thus extruded and having merged at the exit of the extruders, the materials or material mixtures are cooled down and solidified. A three-layer laminated structure is thus produced, which may be subsequently perforated so as to result in the multi-layered structure 1000 to be applied to the surface of a back-contact back-sheet.

The coextrusion process may be performed by means of a commercially available apparatus.

The first tank contains one or more encapsulating materials constituting upper layer 280 of the multi-layered structure described above and shown, for example, in FIG. 6.

The materials or material mixture contained in the first tank must be such as to provide upper layer 280 with the desired chemical and physical properties. In particular, upper layer 280 must easily melt, must be cross-linkable and must guarantee a satisfactory adhesion of the cells to multi-layered structure 1000. Upper layer 280 must also be compatible with further layers of encapsulating material used in the photovoltaic module. For example, upper layer 280 must also be compatible with the layer or layers 450 of encapsulating material arranged between the cells and the upper layer 800 made of transparent material and shown in FIGS. 3 and 4. Therefore, according to an embodiment of the present invention, the first tank may contain one or more than one of the following materials: EVA, silicones, ionomers, thermo-polyurethanes, polyolefins, thermopolyolefins, terpolymers grafted with maleic anhydride.

Still with reference to FIG. 6, the third tank contains one or more materials constituting lower layer 270 of the multi-layered structure described above. The material or material mixture constituting lower layer 270 must ensure a satisfactory adhesion of lower layer 270 to the surface of electrically conductive material layer 220, as well as to the portion of the surface of substrate 210 left exposed by the connecting circuit formed in the conductive material layer 220. Furthermore, the material or material mixture forming lower layer 270 must be such that lower layer 270 is able to conform according to the different heights of the inner face of the back-contact back-sheet and to fill all existing voids. Moreover, lower 270 must adhere as firmly as possible to the lower surface 244 of intermediate layer 240 faced by lower layer 270.

Thus, the material or material mixture of which lower layer 270 is comprised must provide lower layer 270 with high meltability, a high fluidity at lamination temperatures and a high adhesion force with both intermediate layer 240 and the inner face of the back-contact back-sheet upon which multi-layered structure 1000 is adapted to be applied.

Therefore, according to an embodiment of the present invention, the third tank may contain one or more resins chosen among epoxy resins, epoxy-phenolic resins, co-polyester resins, polyurethane resins, or polyolefin ionomer resins.

According to an alternative embodiment, the third tank may contain, analogously to the first tank, one or more than one of the following encapsulating materials: EVA, silicones, ionomers, thermo-polyurethanes, polyolefins, thermopolyolefins, terpolymers grafted with maleic anhydride. In order to use coextrusion for producing laminated structure 1000, a material or a material class must be found for each of the three layers, whose melting temperature does not vary from the melting temperature of the other materials to be coextruded, since the difference in melting temperatures may not exceed 50° C. to 60° C. However, the material or materials to be used for intermediate layer 240 must maintain the same property as PET with respect to the materials used for outer layers 270 and 280 (for instance EVA). More specifically, the material used for intermediate layer 240 must have a melting temperature considerably higher than the melting temperature of the materials used for outer layers 270 and 280. This is necessary in order to prevent intermediate layer 240 from melting together with upper layer 280 and lower layer 270 during a lamination process performed in the course of the procedure of assembling the photovoltaic module. Furthermore, intermediate layer 240 must have a high elastic modulus, i.e. an elastic modulus which is much greater than the elastic moduli of upper layer 280 and lower layer 270. This is necessary in order to confer multi-layered structure 1000 the mechanical stiffness that upper layer 280 and lower layer 270 typically lack when used separately.

The materials which match all conditions described above and can therefore be used as constituents of intermediate layer 240 comprise: ionomers, polyolefins, linear high density polyethylene (LHDPE), linear low density polyethylene (LLDPA), polypropilene (PP), polyimide (PI), polyethylene terephthalate (PET), polyesters with a low melting point.

According to an advantageous embodiment of the present invention, intermediate layer 240 comprises PET and PP with a low melting temperature. Using these materials is advantageous in that they allow the mechanical characteristics of the structure to be maintained during the subsequent lamination stage.

The coextrusion process eliminates the need of interposing an intermediate adhesive layer between the intermediate layer 240 and upper layer 280 or lower layer 270. Getting rid of intermediate adhesive layers which might reduce the lifetime of the assembled solar module is advantageous. Indeed, a well known fact in the state of the art is that adhesive systems placed between adjacent layers are particularly subject to aging and wear processes, especially due to residual moisture in the module and UV radiation.

Furthermore, thanks to the coextrusion process, the need of applying a surface treatment to the intermediate layer 240 before depositing the upper layer 280 or the lower layer 270 is eliminated. Finally, thanks to the deposition by coextrusion, the three layers making up the laminated structure may be formed using a single-step-process, thereby saving time, energy and resources.

After thermo-adhesive material layer 270, dielectric material layer 240, and encapsulating material layer 280 have been produced and fixed to each other, multi-layered structure 1000 is pierced or perforated, so as to obtain a plurality of through holes 286 in predetermined positions. As previously said, through holes 286 are pierced so as to enable an electrical connection between contacts 624 and 640 on the rear surface of the cells which will be assembled in the photovoltaic module and the connecting circuit formed on the inner surface of the back-contact back-sheet. Through holes 286 are then pierced in multilayered structure 1000 so as to reproduce the pattern according to which ohmic contacts 624 and 640 are formed on the rear surface of the cells to be assembled in the module.

Dielectric material layer 240 supporting encapsulating material layer 280 provides the structure 1000 with a mechanical stability which a single encapsulating material foil would lack. Since structure 1000 is mechanically rigid and stable, it is much easier to be perforated with a plurality of through holes than a single foil of encapsulating material.

According to an embodiment of the present invention, the step of piercing structure 1000 occurs by means of trough-punching. Punching offers the advantage of repeatability, since a mould may be used comprising a matrix wherein a plurality of punches is arranged so as to reproduce a predetermined pattern. In particular, the plurality of punches may be arranged so as to reproduce the pattern according to which holes 286 to be pierced in structure 1000 are to be arranged. This matrix may, for example, comprise 31 punches, each arranged so as to correspond to the position of one of ohmic contact 624 or 640 on the rear surface 600 shown in FIG. 1b. The mould with the matrix may then be translated by a predetermined distance and direction so as to pierce the holes across the entire surface of multi-layered structure 1000. According to other embodiments of the present invention, the step of piercing multilayered structure 1000 is performed by means of laser contouring or milling.

Figure 9:
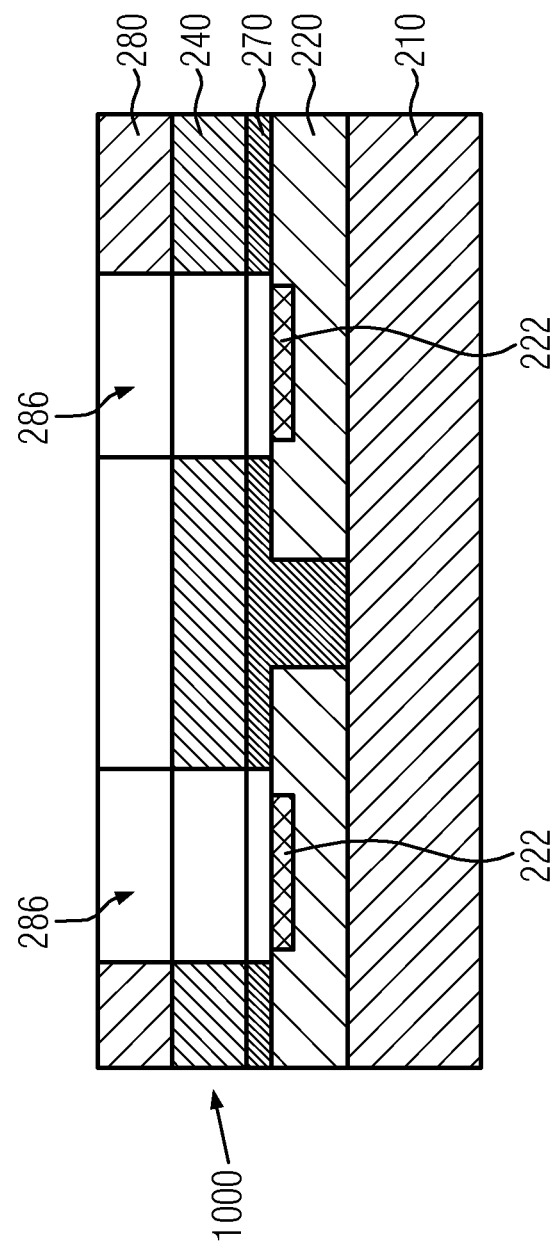
FIG. 9 shows a cross section of a system comprising a multi-layered structure according to an embodiment of the present invention and a portion of the back-contact back-sheet on the surface of which the multi-layered structure is applied, after the system has undergone a lamination process.

Multilayered structure 1000, after being pierced, may be marketed as a single component. According to a further embodiment of the present invention, the perforated multi-layered structure 1000 may be applied to the surface of a back-contact back-sheet, aligned and fixed to the back-contact back-sheet, as shown in FIG. 9. Fixing multilayered structure 1000 to the back-contact back-sheet may be accomplished, for example, by means of a hot-lamination process, or by means of selective laser heating in predetermined areas of the system, or by means of a thermo-adhesive 270 with weak properties of cold-adhesion. Heating the system results in partial melting of the thermo-adhesive or encapsulating material making up lower layer 270 arranged between dielectric material 240 and the surface of back-contact back-sheet. Lower layer 270, while melting, causes structure 1000 to be fixed to the back-contact back-sheet. Furthermore, the thermo-adhesive or encapsulating material of which lower layer 270 is comprised penetrates, after melting, into the interstices between adjacent paths of the connecting circuit of conductive material layer 220, as shown in FIG. 9. In this manner, lower layer 270 accomplishes the task of electrical insulator, which in the back-contact back-sheet according to prior art shown in FIG. 5 is performed by dielectric layer 246.

According to an embodiment, lower layer 270 is such as to ensure a non-final attachment between multi-layered structure 1000 and the back-contact back-sheet. In particular, lower layer 270, after melting and solidifying again, fixes dielectric layer 240 to conductive material 220 so as to allow subsequent stages of module assembly to be carried out. However, according to this embodiment, lower layer 270 does not guarantee the final attachment, i.e. the adhesion force established between dielectric layer 240 and conductive material layer 220 after the solar module has been completed. This final adhesion may be achieved in a process stage wherein the solar module is assembled, for example during the lamination process previously described, analogously to the procedure described above in relation to adhesion between dielectric layer 240 and encapsulating material layer 280.

According to the embodiment of FIG. 9, an integrated system is provided, wherein the lower encapsulating material layer 400 is included into the system and firmly fixed thereto. In this manner, a producer of photovoltaic modules does not have to face the problem of perforating the lower encapsulating material layer before mounting the module, so that the holes in the encapsulating layer reproduce the same pattern as the pads on the connecting circuit of the conductive material layer. The need of aligning the encapsulating material layer to the back-contact back-sheet is also eliminated thanks to the system shown in FIG. 9. Furthermore, a producer of solar modules may speed up, simplify and optimize the production while simultaneously improving its quality. Indeed, thanks to the system formed by the back-contact back-sheet and by multilayered structure 1000 shown in FIG. 9, all risks related to a lateral shift of the encapsulating material layer with respect to the back-contact back-sheet are eliminated during all assembly stages.

According to a further embodiment of the present invention after multi-layered structure 100 has been aligned and fixed to the back-contact back-sheet as previously described, a plurality of conductive elements is deposited through holes 286 in multilayered structure 1000 onto the surface of the connecting circuit formed in conductive layer 220. Each conductive element is deposited in a predetermined position of the connecting circuit. In particular, each conductive element is deposited in correspondence to one of the pads 222 for electrical connection to the ohmic contacts of cells 600. The conductive elements are deposited onto contact pads 222 through holes 286 preferably as a thin film. The main task of the conductive elements is preventing oxidation and/or damage of the surface of conductive pads 222 of conductive material layer 220 exposed through holes 286 from occurring. Furthermore, the film, preferably thin, formed by the conductive elements on the surface of pads 222 forms an interface toward ohmic contacts of the cells which renders the subsequent deposition of conductive adhesive 300 easier and more effective. According to an embodiment of the present invention, the conductive elements comprise an adhesive conductive paste such as ECA.

After the multilayered structure 1000 has been fixed to the back-contact back-sheet, the subsequent stages of photovoltaic module assembly may be carried out. In particular, as shown in FIG. 8, conductive paste 300 is deposited through holes 286 onto contact pads 222 of the connecting circuit formed in conductive layer 220. Solar cells 600 are then laid onto encapsulating material layer 280 so that ohmic contacts 624 and 640 are in contact with conductive paste 300, as previously described. The following assembly stages also follow the procedure previously described.

The present invention thus provides a perforated multi-layered structure 1000 to be used in conjunction with a back-contact back-sheet for photovoltaic modules comprising back-contact cells.

The multilayered structure 1000 entails numerous advantages which render the assembly procedure of a photovoltaic module faster, more cost-effective and more precise.

Structure 1000 has mechanical stability due to the presence of hardly extendible dielectric material layer 240. Consequently, structure 1000 is relatively easy to be pierced or punched. Structure 1000 allows one to avoid using dielectric material layer 246 deposited onto the surface of the back-contact back-sheet as shown in FIG. 5. Dielectric layer 246 typically comprises a polymeric material, which requires appropriate curing, drying and polymerization processes. Furthermore, dielectric material layer 246 shown in FIG. 5 entirely covers the connecting circuit, except for connection pads 222 which correspond to openings in the dielectric layer 246 with a diameter of about 2.5 to 3.5 .mm. Therefore, aligning the perforated encapsulating layer with the openings of the dielectric layer is a critical task when using the method known from the prior art, in that the holes of the encapsulating layer must exactly correspond to the openings of the dielectric layer and to the conductive pads 222.

Structure 1000 comprises both the encapsulating material layer 280 and the dielectric material layer 240. Both layers are perforated simultaneously, before being applied to the back-contact back-sheet. Therefore, thanks to multi-layered structure 1000, the problem of aligning the encapsulant with the openings of the dielectric layer which leave the pads exposed does not have to be faced. Multilayered structure 1000 must still be aligned with the back-contact back-sheet, but in such a way that each through-hole 286 of structure 1000 corresponds to a path of the connecting circuit and not exactly to a pad 222. Thus, the task of aligning structure 1000 with the back-contact back-sheet is much less critical than aligning a single perforated sheet of encapsulating material with the back-contact back-sheet coated with dielectric material 246. Furthermore, structure 1000 may be fixed to the back-contact back-sheet and be marketed together with the back-contact back-sheet as a unique product to be provided to a producer of photovoltaic modules.

A further variation of the described process provides that, after the complex comprised of the back-contact back-sheet with the structure 1000 has been assembled, a thin film of a conductive adhesive is deposited through apertures 286 onto conductive surface 220. Such a deposition prevents the exposed surface of conductive material layer 220 from oxidizing. Furthermore, the deposited conductive film has an interface towards the ohmic contacts of the cell which will facilitate the subsequent deposition of conductive adhesive 300.

Although the present invention has been described with reference to the embodiments described above, it is clear to a skilled person that it is possible to implement several modifications, variations, and improvements of the present invention in view of the teaching described above and within the scope of the enclosed claims, without departing from the object and the scope of protection of the invention. Furthermore, those areas that are deemed to be known by the skilled person have not been dealt with so as not to unduly obfuscate the described invention. Consequently, the invention is not restricted to the embodiments described above, but it is limited exclusively by the scope of protection of the enclosed claims.

The invention claimed is:

1. A multi-layered structure adapted to be applied to a surface of a back-contact back-sheet for a photovoltaic module comprising back-contact solar cells, said structure comprising:
   a layer of dielectric material comprising a lower surface facing an outside of said structure and an upper surface opposite said lower surface, said layer of dielectric material having a plurality of through-holes,
   a layer of encapsulating material coupled to said layer of dielectric material so as to be firmly fixed to said upper surface of said layer of dielectric material, said layer of encapsulating material having a plurality of through-holes,
   a layer of thermo-adhesive material coupled to said lower surface of said layer of dielectric material so as to allow said layer of dielectric material to steadily adhere to said surface of said back-contact back-sheet, said layer of thermo-adhesive material having a plurality of through-holes,
   said multi-layered structure being such that:
   each of said through-holes of said layer of encapsulating material is made in a position corresponding to the position of one of said through-holes of said layer of dielectric material, and
   each of said through-holes of said layer of said thermal adhesive layer is made in a position corresponding to the position of one of said through-holes of said layer of dielectric material and to the position of one of said through-holes of said layer of encapsulating material,
   in such a way that said multi-layered structure has a plurality of through-holes.

2. The multi-layered structure according to claim 1 wherein said layer of encapsulating material comprises at least one of the following materials: EVA, silicones, ionomer resins, thermo-polyurethanes, polyolefins, thermopolyolefins, terpolymers grafted with maleic anhydride.

3. The multi-layered structure according to claim 1 wherein said layer of encapsulating material has a thickness between 100 and 500 µm.

4. The multi-layered structure according to claim 1 wherein said layer of dielectric material comprises a non-extendible-film.

5. The multi-layered structure according to claim 1 wherein said layer of dielectric material comprises polyethylene terephthalate (PET) or polypropylene (PP), or polyimide (PI).

6. The multi-layered structure according to claim 1 wherein said layer of dielectric material has a thickness between 23 and 36 µm.

7. The multi-layered structure according to claim 1 wherein said upper surface of said layer of dielectric material has a chemical or physical treatment such as to enable a stable adhesion between said layer of dielectric material and said layer of encapsulating material.

8. The multi-layered structure according to claim 7 wherein said physical treatment comprises a corona treatment or a plasma treatment.

9. The multi-layered structure according to claim 7 wherein said physical treatment comprises applying a primer layer, said primer layer comprising polyester, copolyester, or an acrylic polymer.

10. The multi-layered structure according to claim 1 wherein said layer of thermo-adhesive material comprises a resin selected from the group consisting of epoxy, epoxy phenolic, co-polyester, polyurethane and polyolefin ionomer resins.

11. The multi-layered structure according to claim 10 wherein said resin is thermoplastic or thermosetting, said resin having a melting temperature between 60° C. and 160° C., said resin being non-sticky when cold-processed.

12. The multi-layered structure according to claim 1 wherein said layer of thermo-adhesive material comprises at least one of the following materials: EVA, silicones, ionomer resins, thermo-polyurethanes, polyolefins, thermopolyolefins, terpolymers grafted with maleic anhydride.

13. A back-contact back-sheet for a photovoltaic module comprising back-contact solar cells, said back-contact back-sheet comprising a surface, said surface of said back-contact back-sheet comprising a layer of electrically conductive material formed as a connecting circuit to the electrodes of said solar cells and steadily adhering to said surface of said back-contact back-sheet, a multi-layered structure according to one of claims from claim 1 being firmly fixed to said surface of said back-contact back-sheet.

14. The back-contact back-sheet according to claim 13 further comprising a plurality of conducting elements on the surface of said connecting circuit formed in said layer of conducting material, each of said conducting elements being deposited in a predetermined position of said connecting circuits through one of said through-holes of said multi-layered structured, said conducting elements serving as a protection against oxidation of said layer of conducting material.

15. A method for producing a multi-layered structure adapted to be applied to a surface of a back-contact back-sheet for a photovoltaic module comprising back-contact solar cells, said method comprising the steps of:
   forming a layer of dielectric material, said layer of dielectric material comprising a lower surface facing the outside of said structure and an upper surface opposite said lower surface,
   forming and applying a layer of encapsulating material on said upper surface of said layer of dielectric material, said step of forming and applying the layer of encapsulating material being performed in such a way that said layer of encapsulating material is firmly fixed to said layer of dielectric material, forming and applying a layer of thermo-adhesive material to said lower surface of said layer of dielectric material so as to enable a steady adhesion between said layer of dielectric material and said surface of said back-contact back-sheet, said step of forming and applying the layer of thermo-adhesive material being performed in such a way that said layer of thermal adhesive material is firmly fixed to said layer of dielectric material, piercing said multi-layered structure so as to make, in said multi-layered structure, a plurality of through-holes in predetermined positions.

16. The method according to claim 15 further comprising a physical or chemical treatment of said upper surface of said layer of dielectric material so as to enable a steady adhesion between said layer of dielectric material and said layer of encapsulating material, said treatment being performed before said step of forming and applying said layer of encapsulating material to said upper surface of said layer of dielectric material.

17. The method according to claim 16 wherein said physical or chemical treatment comprises a corona treatment or a plasma treatment.

18. The method according to claim 16 wherein said physical or chemical treatment comprises applying a layer of primer, said layer of primer comprising polyester, co-polyester or an acrylic polymer.

19. The method according to claim 15 wherein said layer of thermo-adhesive material is applied to said lower surface of said layer of dielectric material by means of extrusion or hot-lamination.

20. The method according to claim 15 wherein said layer of thermo-adhesive material is applied to said lower surface of said layer of dielectric material by means of an intermediate adhesive layer.

21. The method according to claim 15, wherein said steps of forming said layer of dielectric material, forming and applying said layer of encapsulating material, forming and applying said layer of thermo-adhesive material comprise:
  introducing a first material into a first tank connected to a first extruder;
  introducing a second material into a second tank connected to a second extruder;
  introducing a third material into a third tank connected to a third extruder;
  simultaneously coextruding the first, second, and third materials;
  letting the coextruded materials cool down so as to obtain a three-layered structure comprising said layer of encapsulating material extruded by the first extruder, said layer of dielectric material extruded by the second extruder and said layer of thermo-adhesive material extruded by the third extruder.

22. The method according to claim 21, wherein said second extruder is arranged below said first extruder and said third extruder is arranged below said second extruder.

23. The method according to claim 15, wherein said step of piercing said multi-layered structure is performed by punching said multi-layered structure.

24. The method according to claim 23 wherein said step of punching said multi-layered structure is carried out by a matrix made up of punches arranged to reproduce a predetermined pattern.

25. The method according to claim 15, wherein said step of piercing said multi-layered structure is performed by laser contouring or mechanical milling.

26. The method according to claim 15 wherein said layer of encapsulating material is steadily and permanently connected to said layer of dielectric material during a lamination process of said photovoltaic module completely assembled.

27. The method according to claim 26 wherein said lamination is performed during a cycle in vacuum at temperatures between 140° C. and 165° C.

28. The method according to claim 15 further comprising the step of fixing said multi-layered structure to said surface of said back-contact back-sheet, said surface of said back-contact back-sheet comprising a layer of electrically conducting material formed as a connecting circuit to the electrodes of said solar cells and firmly fixed to said surface of said back contact back-sheet, said step of fixing said multi-layered structure to said surface of said back-contact back-sheet being performed after said step of piercing said multi-layered structure.

29. The method according to claim 28 wherein said multi-layered structure is steadily and permanently connected to said back-contact back-sheet during a lamination of said photovoltaic module completely assembled.

30. The method according to claim 28 further comprising a step of depositing a plurality of conducting elements on the surface of said connecting circuit formed on said layer of conducting material, each of said conducting elements being deposited in a predetermined position of said connecting circuit through one of said through-holes of said multi-layered structure, said step of depositing said plurality of said conducting elements being performed after said step of fixing said multi-layered structure to said back-contact back-sheet, said step of depositing said plurality of said conducting elements being performed as a protection against oxidization of the surface of said layer of electrically conductive material.

* * * * *